(12) United States Patent
Moriyama

(10) Patent No.: US 6,414,388 B1
(45) Date of Patent: Jul. 2, 2002

(54) LIGHT EMITTING/RECEIVING ELEMENT FOR OPTICAL PICKUP APPARATUS

(75) Inventor: Katsuya Moriyama, Nagano (JP)

(73) Assignee: Kabushiki Kaisha Sankyo Seiki Seisakusho, Nagano (JP)

( * ) Notice: Subject to any disclaimer, the term of this patent is extended or adjusted under 35 U.S.C. 154(b) by 0 days.

(21) Appl. No.: 09/615,733

(22) Filed: Jul. 13, 2000

(30) Foreign Application Priority Data

Jul. 14, 1999 (JP) .............................................. 11-200395

(51) Int. Cl.[7] .......................... H01L 23/34; H01L 23/10; H01L 31/00; H01L 31/0203; H01L 23/495
(52) U.S. Cl. ....................... 257/724; 257/431; 257/432; 257/433; 257/675; 257/676; 257/706; 257/707
(58) Field of Search ................................. 257/431, 432, 257/433, 675, 676, 706, 707, 724; 372/43

(56) References Cited

U.S. PATENT DOCUMENTS

| 4,446,375 A | * | 5/1984 | Aird ........................... 250/551 |
|---|---|---|---|
| 4,877,756 A | * | 10/1989 | Yamamoto et al. .......... 437/209 |
| 4,906,839 A | * | 3/1990 | Lee .............................. 250/239 |
| 5,049,973 A | * | 9/1991 | Satrino et al. ................. 357/70 |
| 5,727,009 A | * | 3/1998 | Tajiri et al. ..................... 372/43 |
| 5,825,794 A | * | 10/1998 | Ognino et al. ................. 372/36 |
| 5,881,193 A | * | 3/1999 | Anigbo et al. ................ 385/93 |
| 6,180,962 B1 | * | 1/2001 | Ishinaga ...................... 257/99 |
| 6,188,062 B1 | * | 2/2001 | Lee ............................. 250/237 |
| 6,188,132 B1 | * | 2/2001 | Shih et al. ................... 257/724 |

FOREIGN PATENT DOCUMENTS

JP  405021887 A  *  1/1993

* cited by examiner

Primary Examiner—Eddie Lee
Assistant Examiner—Joseph Nguyen
(74) Attorney, Agent, or Firm—Sughrue Mion, PLLC

(57) ABSTRACT

A flat plate section 2a and a protruded section 2b are formed in a metallic radiator plate 2, a first semiconductor substrate 4 with a light receptor 3 mounted thereon is disposed on the flat plate section 2a of the metallic radiator plate 2, and a second semiconductor substrate 7 with a laser diode 5 and a monitoring light receptor 6 mounted thereon is disposed on the protruded section 2b of the metallic radiator plate 2.

10 Claims, 4 Drawing Sheets

LIGHT EMITTING/RECEIVING ELEMENT FOR OPTICAL PICKUP APPARATUS

BACKGROUND OF THE INVENTION

The present invention relates to a light emitting/receiving element for an optical pickup apparatus. More particularly, the present invention concerns a light emitting/receiving element incorporated in an optical pickup apparatus in which a second semiconductor substrate provided with a laser diode and a monitoring light receptor is disposed at a position higher than a first semiconductor substrate provided with a light receptor. It should be noted that the heightwise direction referred to hereunder means a direction which is perpendicular to a metallic radiator plate and on which a protruded section is formed.

As a related light emitting/receiving element for an optical pickup apparatus, a holographic optical element (HOE) unit used in an optical pickup apparatus such as a CD player is shown in FIG. 6. This light emitting/receiving element 101 is so constructed that a light receptor (photodiode) 103 and a circuit for calculating a focus error signal or the like are formed on an IC chip (first semiconductor substrate) 102, and a submount (second semiconductor substrate) 105 with a monitoring light receptor (PIN photodiode) 104 formed thereon and a laser diode (light emitter) 106 are superposed on the IC chip 102. The reason for superposing the submount 105 and the laser diode 106 on the IC chip 102 in this manner is to dispose the laser diode 106 at a predetermined height with respect to the IC chip 102 in view of the relationship with an HOE optical system, and to make return light from a recording medium incident upon the light receptor 103 on the IC chip 102. It should be noted that, in FIG. 6, reference numeral 107 denotes an electrode, numeral 108 denotes a bonding wire, and numeral 109 denotes Ag paste.

The laser light emitted from the front side of the laser diode 106 is reflected by a reflecting mirror, is focused by a lens, and forms an image as a spot on a recording medium such as a CD. The return light from the recording medium is reflected by the reflecting mirror, is diffracted by an optical element, and is incident upon the light receptor 103 on the IC chip 102. The laser light emitted from the rear side of the laser diode 106 is incident upon the monitoring light receptor 104 on the submount 105 so as to be used for monitoring.

However, with the aforementioned light emitting/receiving element 101, there has been a drawback in that the size of the IC chip 102 becomes large since the submount 105 and the laser diode 106 are superposed on the IC chip 102. Namely, despite the fact that the area of the IC chip 102 where the submount 105 is mounted is an area which is functionally unnecessary as the IC chip 102, the size of the IC chip 102 becomes large by the portion of this mounting area for the sole purpose of superposing the laser diode 106 thereon. For this reason, the number of chips which can be manufactured from one semiconductor wafer is reduced, thereby increasing the manufacturing cost.

In addition, since the laser diode 106 radiates heat, there is a need to efficiently transmit this heat to another member so as to speedily dissipate the heat. With the aforementioned light emitting/receiving element 101, however, since the IC chip 102 with the submount 105 and the laser diode 106 superposed thereon is mounted on a lead frame of the HOE unit, it is necessary to adopt a heat radiating means such as by widening the ground (GND) terminal of the lead frame in terms of its shape so as to increase its heat radiating area or by causing this GND terminal to abut against a frame of the optical pickup apparatus so as to dissipate the heat to the frame. The structure for such a purpose is complicated, which increases the manufacturing cost.

SUMMARY OF THE INVENTION

The object of the invention is to provide a light emitting/receiving element for an optical pickup apparatus which makes it possible to reduce the size of the IC chip and obtain a satisfactory heat radiation characteristic with a simple structure.

In order to achieve the above object, according to the present invention, a flat plate section and a protruded section are formed in a metallic radiator plate. Then a first semiconductor substrate with a light receptor mounted thereon is disposed on the flat plate section of the metallic radiator plate, and a second semiconductor substrate with a laser diode and a monitoring light receptor mounted thereon is disposed on the protruded section of the metallic radiator plate. Accordingly, it is unnecessary to mount the second semiconductor substrate on the first semiconductor substrate, so that the first semiconductor substrate can be made small. For this reason, it is possible to increase the number of first semiconductor substrates which can be manufactured from one semiconductor wafer, thereby making it possible to reduce the manufacturing cost of the first semiconductor substrate. In addition, since the first semiconductor substrate can be made small, the optical pickup apparatus into which the light emitting/receiving element is incorporated can be made compact and lightweight.

In addition, since the heat generated by the laser diode can be transmitted to the metallic radiator plate so as to be dissipated, the heat radiation characteristic of the laser diode can be improved. Moreover, since the structure for heat radiation is made simple, the manufacturing cost can be lowered. Furthermore, since it is possible not to use the base substrate as a heat radiator, it becomes possible to use a resin substrate which is low in cost and on which a complicated circuit can be formed.

Alternatively, a recessed portion and a flat plate section may be formed in a metallic radiator plate. Then, a first semiconductor substrate with a light receptor mounted thereon is disposed in the recessed portion of the metallic radiator plate, and a second semiconductor substrate with a laser diode and a monitoring light receptor mounted thereon is disposed on the flat plate section of the metallic radiator plate. Therefore, in the same way as the above configuration, the first semiconductor substrate can be made small, and it is possible to reduce the manufacturing cost of the first semiconductor substrate. At the same time, the optical pickup apparatus into which the light emitting/receiving element is incorporated can be made compact and lightweight. In addition, the heat radiation characteristic of the laser diode can be improved, the structure for heat radiation is made simple, thereby making it possible to lower the manufacturing cost. Furthermore, the use of a resin substrate as the base substrate is permitted. In addition, since the second semiconductor substrate for mounting the laser diode thereon is disposed on the flat plate section of the metallic radiator plate, the arrangement facilitates the setting of the heightwise position of the laser diode with high accuracy.

DETAILED DESCRIPTION OF THE PREFERRED EMBODIMENTS

Figure 1:
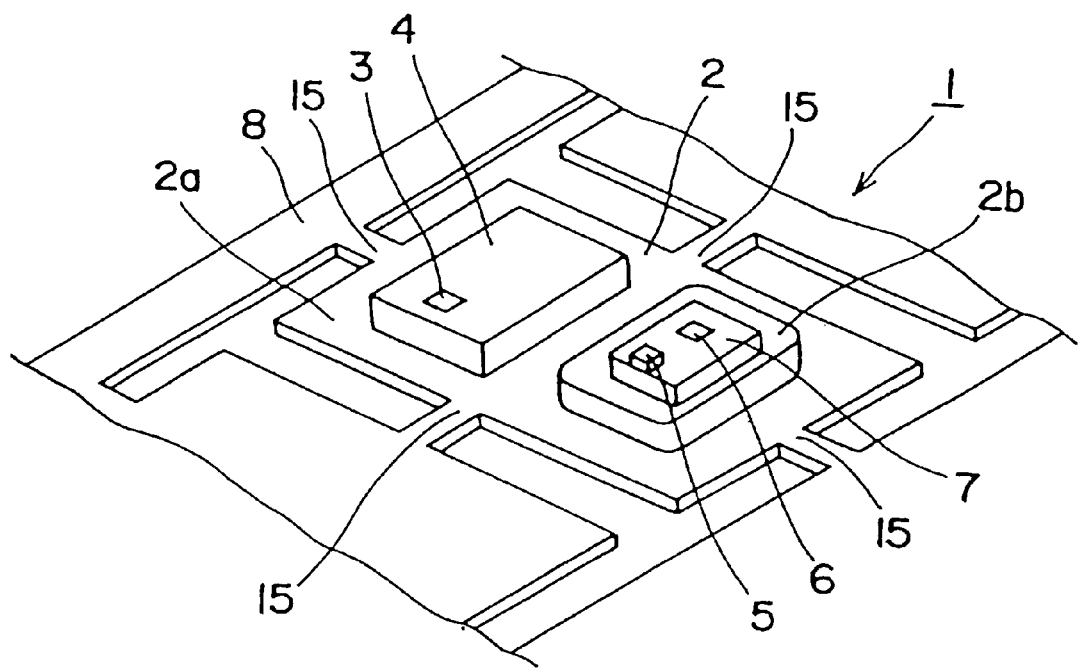
FIG. 1 is a perspective view of a light emitting/receiving element according to a first embodiment of the present invention, showing a state that a metallic radiator plate is formed as a lead frame.

Hereafter, a detailed description will be given of the construction in accordance with the invention on the basis of the best mode illustrated in the drawings.

Figure 2:
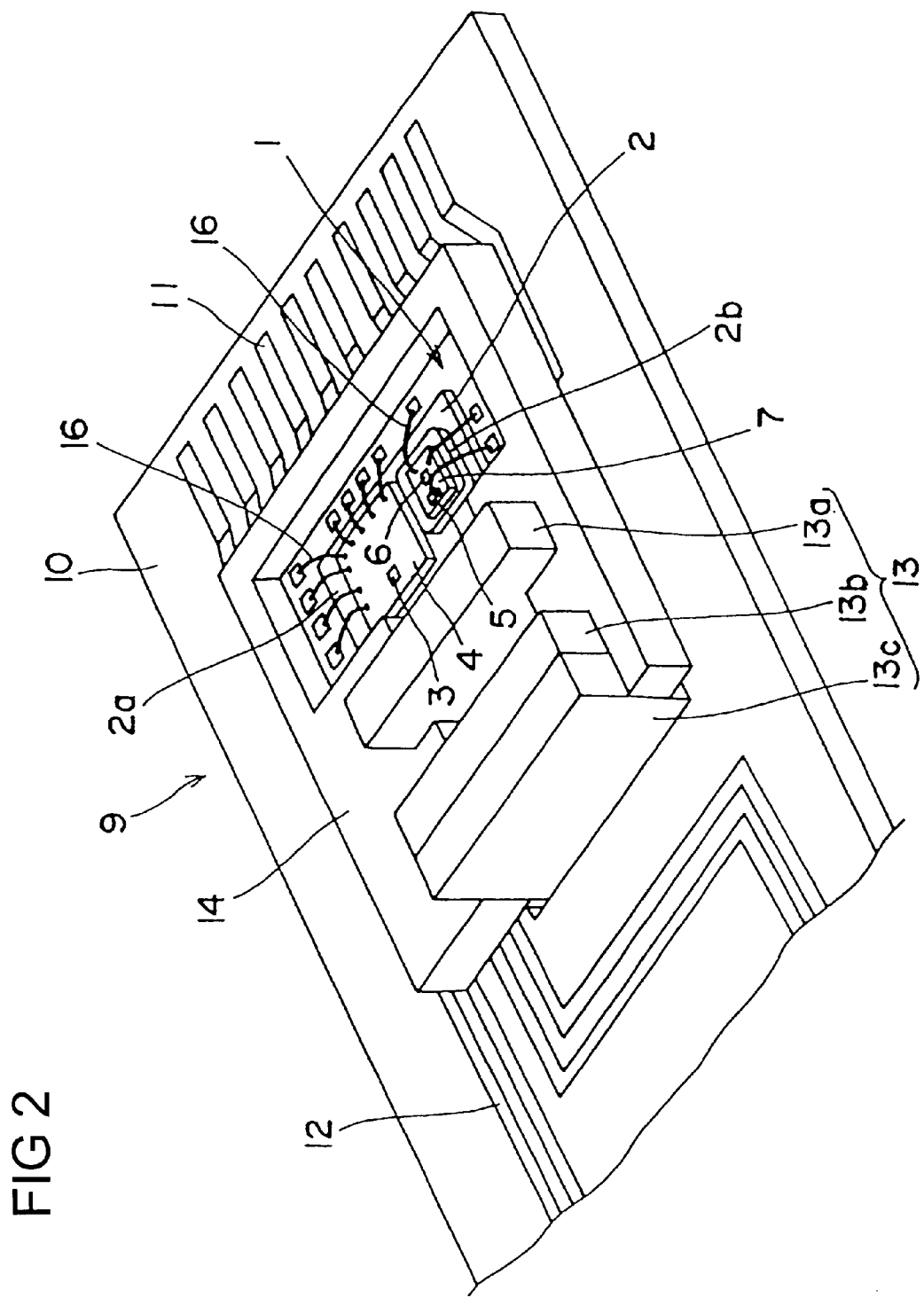
FIG. 2 is a perspective view of an HOE unit incorporating the light emitting/receiving element.

FIGS. 1 and 2 show a light emitting/receiving element for an optical pickup apparatus according to a first embodiment of the invention. A light emitting/receiving element 1 for an optical pickup apparatus (hereafter simply referred to as the light emitting/receiving element) is arranged such that a flat plate section 2a and a protruded section 2b are formed in a metallic radiator plate 2, a first semiconductor substrate 4 with a light receptor 3 mounted thereon is disposed on the flat plate section 2a of the metallic radiator plate 2, and a second semiconductor substrate 7 with a laser diode (light emitter) 5 and a monitoring light receptor 6 mounted thereon is disposed on the protruded section 2b of the metallic radiator plate 2.

As shown in FIG. 1, the metallic radiator plate 2 is formed by a lead frame 8, which is cut at portions designated by the reference numeral 15 after the die bonding of the first and second semiconductor substrates 4 and 7 or the like, and is incorporated into an HOE unit 9, as shown in FIG. 2. Thus, it is possible to improve the operational efficiency of the die bonding by using the metallic radiator plate 2 formed by the lead frame 8.

In addition, the metallic radiator plate 2 is formed by a plate member of e.g., a copper alloy, an aluminum alloy, a low carbon steel, or the like. The protruded section 2b is formed at a predetermined position of the metallic radiator plate 2, as shown by example in FIG. 1. The upper face of the protruded section 2b is parallel to the flat plate section 2a other than the protruded section 2b. Further, the protruded section 2b is formed to assume a predetermined height, such that the laser diode 5 mounted on the second semiconductor substrate 7 can be disposed at a predetermined heightwise position with respect to the flat plate section 2a.

Ag paste is coated on the flat plate section 2a and the protruded section 2b of the metallic radiator plate 2 by printing or the like, and the first and second semiconductor substrates 4 and 7 are disposed on the portion coated with the Ag paste and are then die bonded.

In addition, the metallic radiator plate 2 is electrically joined to a base substrate 10 formed of a metallic plate. By using a metallic plate as the base substrate 10, the heat generated in the laser diode 5 can be transmitted from the metallic radiator plate 2 to the base substrate 10, thereby contributing to the heat radiation characteristic. In this embodiment, the base substrate 10 is formed by an iron plate substrate. In such a case, it is possible to form a yoke for the pickup apparatus. Electrodes 11 and circuit patterns 12 are formed on the base substrate 10, and a holder frame 14 for positioning the metallic radiator plate 2 and optical elements 13 is fixed on the base substrate 10. The holder frame 14 is formed by, for example, photosensitive glass. The optical elements 13 include an HOE 13a serves as a diffractor for splitting laser light into three parts, an HOE 13b serves as a beam splitter, and a phase plate 13c (e.g., a quarter-wave plate).

Next, a description will be given of the process of fabricating the light emitting/receiving element 1 and the HOE unit 9. First, the metallic radiator plate 2 having the protruded section 2b is formed into the shape of a lead frame by press working or the like. It should be noted that the protruded section 2b may be formed by drawing after the metallic radiator plate 2 is formed into the shape of a lead frame.

Next, Ag paste is coated on the flat plate section 2a and the protruded section 2b of the metallic radiator plate 2 by printing or the like. Then, after the first semiconductor substrate 4 is mounted on the flat plate section 2a, and the second semiconductor substrate 7 with the laser diode 5 die bonded thereto is mounted on the protruded section 2b, the first and second semiconductor substrates 4 and 7 are die bonded. Incidentally, Au—Sn paste or the like may be used instead of the Ag paste. Subsequently, the metallic radiator plate 2 is cut at cutting portions indicated by reference numeral 15 in FIG. 1.

Meanwhile, the holder frame 14 is kept fixed to the base substrate 10 with the electrodes (generally, a copper foil provided with Ni plating or Au plating) 11 and the circuit patterns 12 formed thereon, and the cut metallic radiator plate 2 is inserted in this holder frame 14. At this time, the metallic radiator plate 2 is made to abut against the holder frame 14 to accurately position the metallic radiator plate 2 held on the base substrate 10. Subsequently, the base substrate 10 and the metallic radiator plate 2 are electrically joined together, and the first and second semiconductor substrates 4 and 7 and the base substrate 10 are wire bonded by an Au wire 16. It should be noted that in a case where the electrical joining of the base substrate 10 and the metallic radiator plate 2 can be established by wire bonding, the metallic radiator plate 2 may be secured to the base substrate 10 by an adhesive agent excelling in the heat radiation characteristic, such as silicone. Next, the HOEs 13a, the beam splitter 13b, and the phase plate 13c are positioned and secured upon being fitted at predetermined positions in the holder frame 14.

Figure 3:
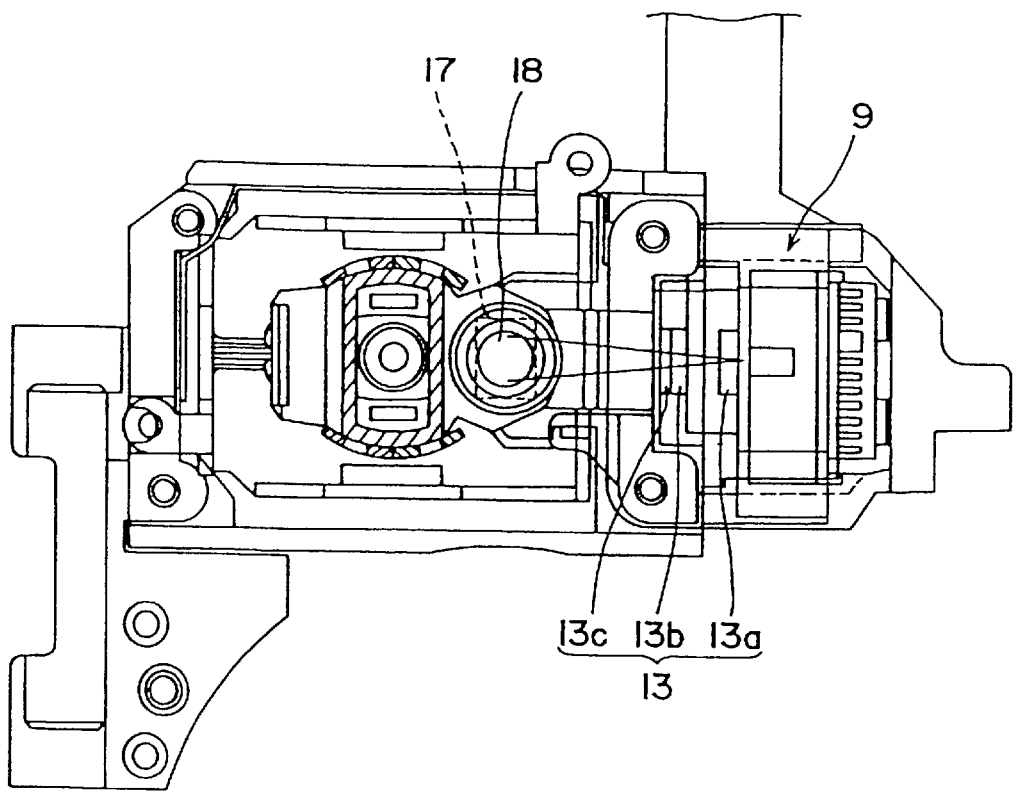
FIG. 3 is a plan view of an optical pickup device incorporating the HOE unit.
Figure 4:
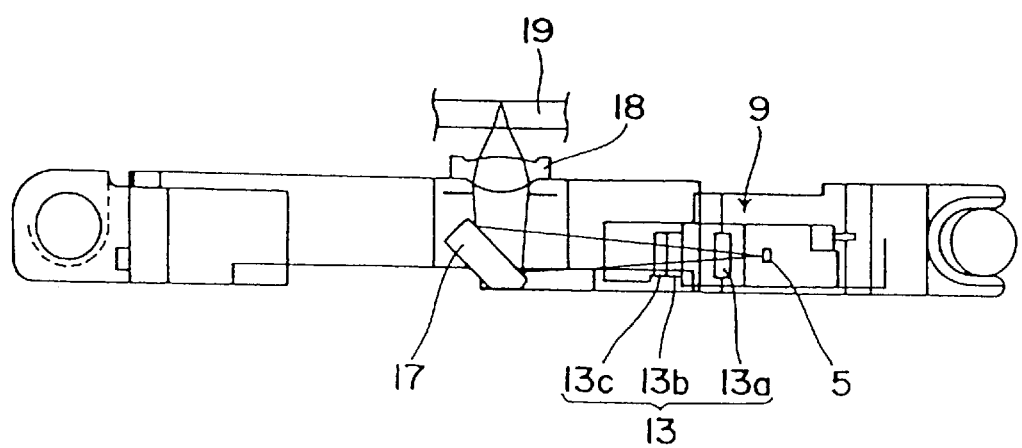
FIG. 4 is a side view of the optical pickup device shown in FIG. 3.
Figure 5:
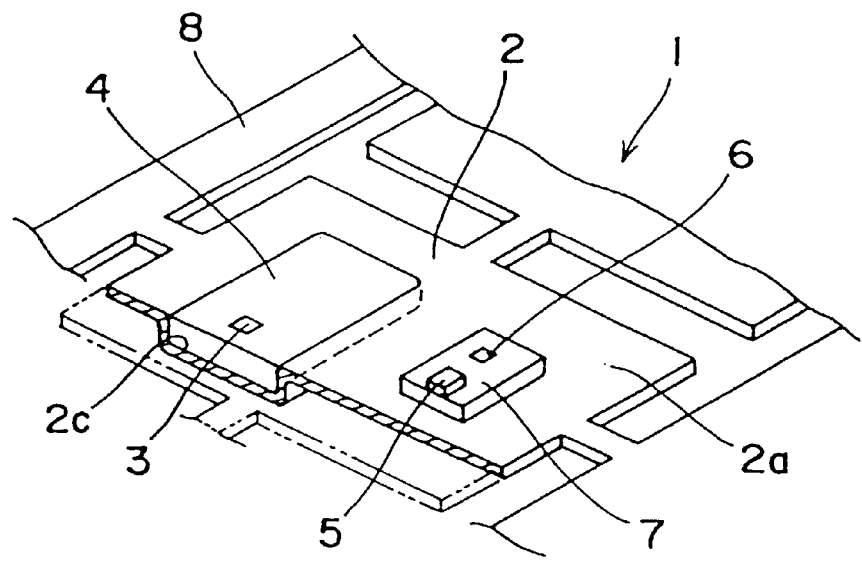
FIG. 5 is a perspective view a light emitting/receiving element according to a second embodiment of the present invention.
Figure 6:
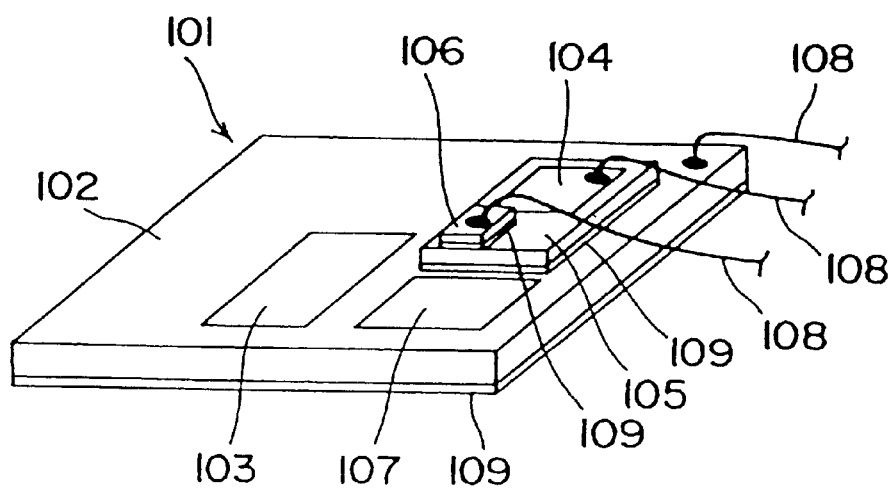
FIG. 6 is a perspective view of a related light emitting/receiving element.

FIGS. 3 and 4 show an example of the optical pickup apparatus incorporating the HOE unit 9. The laser light emitted from the front side of the laser diode 5 of the light emitting/receiving element 1 proceeds in the order of the optical elements 13a, 13b, and 13c, a reflecting mirror 17, and a lens 18, and forms an image on a recording medium 19 such as a CD. The reflected light from the recording medium 19 proceeds in the order of the lens 18, the reflecting mirror 17, and the optical elements 13a, 13b, and 13c, and reaches the light receptor 3 on the first semiconductor substrate 4. It should be noted that the laser light emitted from the rear of the laser diode 5 is incident upon the monitoring light receptor 6 on the second semiconductor substrate 7 so as to be used for monitoring.

In addition, although the above-described embodiment is an example of the preferred embodiment of the invention, the invention is not limited to the same, and various modifications are possible within a range which does not depart from the gist of the invention. For example, as shown in FIG.

5, an arrangement may be provided such that a recessed portion 2c and a flat plate section 2a are formed in the metallic radiator plate 2, the first semiconductor substrate 4 with the light receptor 3 mounted thereon is disposed in the recessed portion 2c of the metallic radiator plate 2, and the second semiconductor substrate 7 with the laser diode 5 and the monitoring light receptor 6 mounted thereon is disposed on the flat plate section 2a of the metallic radiator plate 2. In this case, since the first semiconductor substrate 4 can be positioned by being made to abut against a peripheral wall of the recessed portion 2c, the mounting accuracy of the first semiconductor substrate 4 improves.

In addition, the metallic radiator plate 2 may be extended to the position where the optical elements 13 of the HOE unit 9 are disposed, and the optical elements 13 may be positioned and fixed on the metallic radiator plate 2. In this case, it is easily possible to accurately set the positional relationship between the optical elements 13 on the one hand, and the semiconductor substrates 4 and 7 and the laser diode 5 on the other hand.

Further, the metallic radiator plate 2 may be extended to the position where the reflecting mirror 17 is disposed, a surface having an inclination of 45 degrees may be formed on this extended portion, and the reflecting mirror 17 may be positioned and fixed on the inclined surface. In this case, it is easily possible to accurately set the positional relationship of the relevant members including the reflecting mirror 17, so that the accuracy of the optical system of the pickup apparatus can be improved.

Furthermore, the base substrate is not limited to the base substrate 10 formed by an iron plate substrate, but may be the base plate 10 formed by a printed circuit board.

What is claimed is:

1. A light emitting/receiving element incorporated in an optical pickup apparatus, comprising:
    a first semiconductor substrate on which a photo receptor is mounted;
    a second semiconductor substrate on which a photo emitter and a monitoring photo receptor are mounted;
    a metallic radiator plate having a flat face including a first section in which the first semiconductor substrate is disposed, and second section perpendicularly protruded form the flat face, in which the second semiconductor substrate is disposed; and
    a metallic base substrate electrically joined with the radiator plate.

2. A light emitting/receiving element incorporated in an optical pickup apparatus, comprising:
    a first semiconductor substrate on which a photo receptor is mounted;
    a second semiconductor substrate on which a photo emitter and a monitoring photo receptor are mounted; and
    a metallic radiator plate having a flat face including a first section perpendicularly recessed from the flat face, in which the first semiconductor substrate is disposed, and a second section in which the second semiconductor substrate is disposed.

3. The light emitting/receiving element as set forth in claim 2, wherein the shapes of the recessed section and the first semiconductor substrate are substantially the same.

4. The light emitting/receiving element as set forth in claim 2, further comprising a metallic base substrate electrically joined with the radiator plate.

5. The light emitting/receiving element as set forth in claim 1, wherein the base substrate is made of iron; and
    wherein the base substrate constitutes at least a part of a yoke of the optical pickup apparatus.

6. The light emitting/receiving element as set forth in claim 4, wherein the base substrate is made of iron; and
    wherein the base substrate constitutes at least a part of a yoke of the optical pickup apparatus.

7. The light emitting/receiving element as set forth in claim 1, further comprising a base substrate is a printed circuit board, which is electrically joined with the radiator plate.

8. The light emitting/receiving element as set forth in claim 2, further comprising a base substrate is a printed circuit board, which is electrically joined with the radiator plate.

9. The light emitting/receiving element as set forth in claim 1, wherein the radiator plate is formed into the shape of a lead frame.

10. The light emitting/receiving element as set forth in claim 2, wherein the radiator plate is formed into the shape of a lead frame.

* * * * *